(12) United States Patent
Schenker

(10) Patent No.: US 7,531,295 B2
(45) Date of Patent: May 12, 2009

(54) METHOD AND APPARATUS FOR LITHOGRAPHIC IMAGING USING ASYMMETRIC ILLUMINATION

(75) Inventor: Richard Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 590 days.

(21) Appl. No.: 11/096,531

(22) Filed: Mar. 31, 2005

(65) Prior Publication Data

US 2006/0223007 A1   Oct. 5, 2006

(51) Int. Cl.
*G03F 7/20* (2006.01)
(52) U.S. Cl. ..................................... 430/311
(58) Field of Classification Search .................. 430/311
See application file for complete search history.

(56) References Cited

U.S. PATENT DOCUMENTS

2004/0137338 A1* 7/2004 Inao et al. ...................... 430/5
2005/0123838 A1* 6/2005 Chang et al. ................... 430/5

* cited by examiner

*Primary Examiner*—Kathleen Duda
(74) *Attorney, Agent, or Firm*—Blakely, Sokoloff, Taylor & Zafman LLP

(57) ABSTRACT

According to one aspect of the present invention, a method and apparatus for processing a substrate may be provided. A reticle may be positioned relative to a substrate. The reticle may have a plurality of features with dimensions extending in a first and a second direction and being asymmetric in the first direction. Electromagnetic radiation may be directed onto the reticle. The electromagnetic radiation may have a first portion propagating onto the reticle in substantially the first direction and being incident on the reticle at a first angle and a second portion propagating onto the reticle in substantially the second direction and being incident on the reticle at a second angle. The second angle being greater than the first angle.

15 Claims, 5 Drawing Sheets

METHOD AND APPARATUS FOR LITHOGRAPHIC IMAGING USING ASYMMETRIC ILLUMINATION

BACKGROUND OF THE INVENTION

1). Field of the Invention

Embodiments of this invention relate to a method and apparatus for photolithographic imaging of substrates, such as semiconductor substrates.

2). Discussion of Related Art

Integrated circuits are formed on semiconductor wafers. The wafers are then sawed (or "singulated" or "diced") into microelectronic dice, also known as semiconductor chips, with each chip carrying a respective integrated circuit. Each semiconductor chip is then mounted to a package, or carrier, substrate. Often the packages are then mounted to a motherboard, which may then be installed into a computing system.

Numerous steps may be involved in the creation of the integrated circuits, such as the formation and etching of various semiconductor, insulator, and conductive layers. Before the various layers may be etched, a layer of light-sensitive photoresist is formed on the substrate to protect the portions of the substrate that are not to be etched.

Machines referred to as photolithography steppers are used to expose the desired pattern in the photoresist layer. In order to achieve the desired pattern, light is directed through a reticle, or "mask," and focused onto the substrate. Often the patterns on the masks, and thus the features in a particular layer on the substrate, are asymmetric in one direction. That is, the lines of the features may tend to be longer, or wider, in one direction, such as the "X-direction" in an X/Y coordinate system, than in the "Y-direction."

Typically, the illumination methods used by the light sources in the steppers, such as annular, quadrupole, and hexa-pole, do not share the same asymmetric nature as the features on the mask. The resolution of the features that are exposed on the substrate is thus not maximized, and the size of the devices formed on the substrate is limited.

As the feature size required to be exposed by lithography continues to get smaller, it is necessary for the resolution of the lithography steppers, as well as the fidelity of the exposed structures, to improve.

BRIEF DESCRIPTION OF THE DRAWINGS

Embodiments of the invention is described by way of example with reference to the accompanying drawings, wherein.

DETAILED DESCRIPTION OF THE INVENTION

In the following description, various aspects of the present invention will be described, and various details set forth in order to provide a thorough understanding of the present invention. However, it will be apparent to those skilled in the art that the present invention may be practiced with only some or all of the aspects of the present invention, and the present invention may be practiced without the specific details. In other instances, well-known features may be admitted or simplified in order to not to obscure the present invention.

It should be understood that FIG. 1 through FIG. 5 are merely illustrative and may not be drawn to scale.

Figure 1:
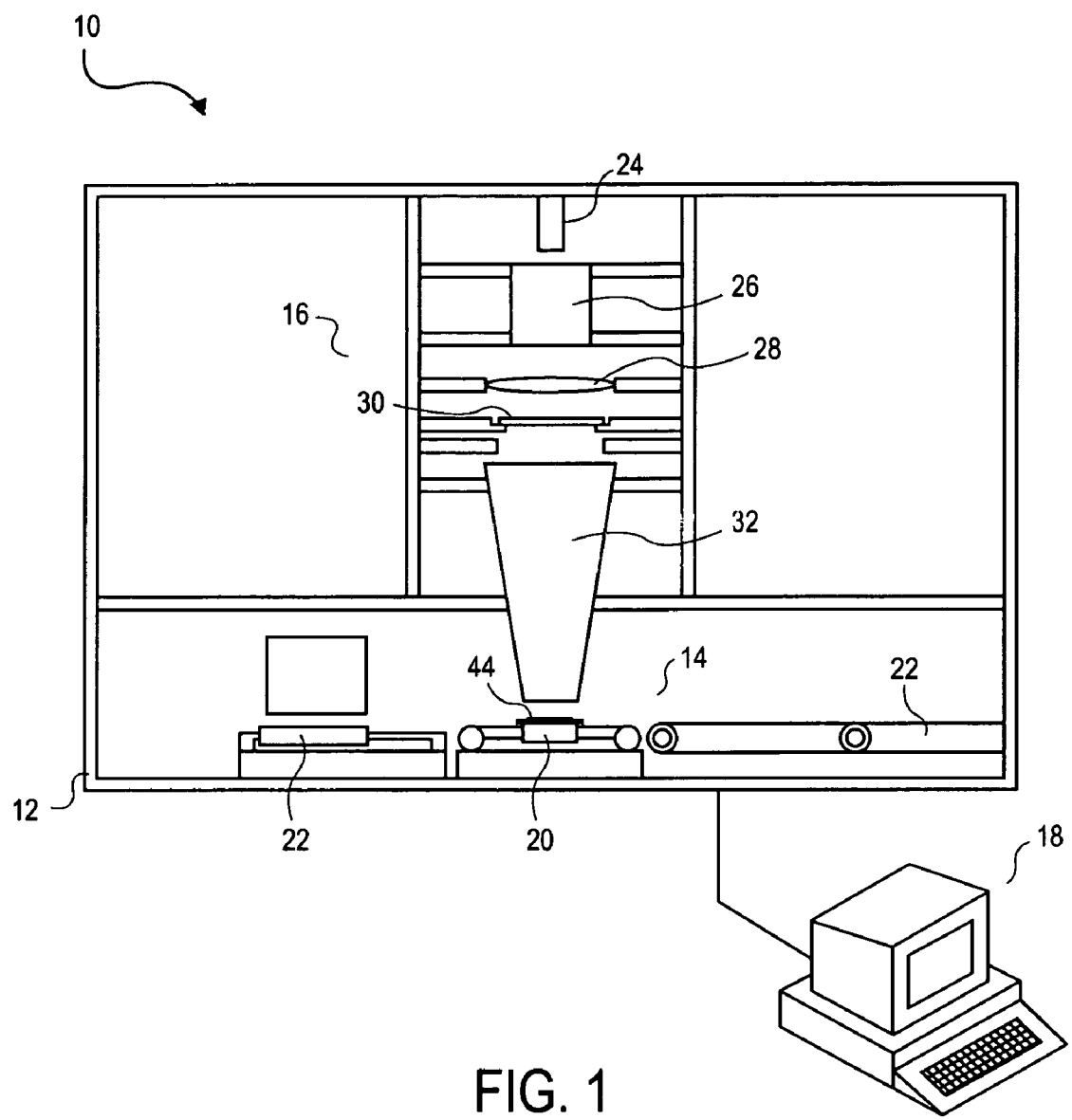
FIG. 1 is a cross-sectional schematic view of a photolithographic stepper.

FIG. 1 illustrates a semiconductor processing apparatus, or a photolithographic stepper 10, according to an embodiment of the present invention. The stepper 10 may include a frame 12, a substrate transport subsystem 14, an exposure subsystem 16, and a computer control console 18. The substrate transport subsystem 14 may be attached to and located at a lower portion of the frame 12 and may include a substrate support 20 and a substrate track 22. The substrate support 20 may be sized to support semiconductor substrates, such as wafers with diameters of, for example, 200 or 300 millimeters. Although not illustrated in detail, the substrate support 20 may include various actuators and motors to move the substrate support 20 in an X/Y coordinate system which may be substantially perpendicular to the sheet, or page, on which FIG. 1 is shown. The substrate track 22 may include various components to place a semiconductor substrate onto the substrate support 20 and remove the semiconductor substrate there from.

The exposure subsystem 16 may be connected to the frame 12 and be suspended substantially over the substrate support 20. The exposure subsystem 16 may include an electromagnetic radiation source 24, a polarization subsystem 26, a collector 28, a reticle 30, and imaging optics 32.

The electromagnetic radiation source 24 may be a visible light source, such as a laser source, and be connected to the frame 12. In one embodiment, the electromagnetic radiation source 24 may be a deep ultraviolet (DUV) light source capable of emitting ultraviolet light having wavelengths of, for example, 248 nanometers (nm), 193 nm, and/or 157 nm. As is discussed below, the electromagnetic radiation source 24 may emit electromagnetic radiation, or light, in an asymmetric annular pattern.

The polarization subsystem 26, the collector 28, the reticle 30, and the imaging optics 32 may be connected to the frame 12 in position under the electromagnetic radiation source and above the semiconductor substrate support 20. The collector 28 may be in the form of a large lens, as is commonly understood in the art. The reticle 30 may be positioned below the collector 28 and may be in the form "mask," as is commonly understood in the art.

Figure 2:
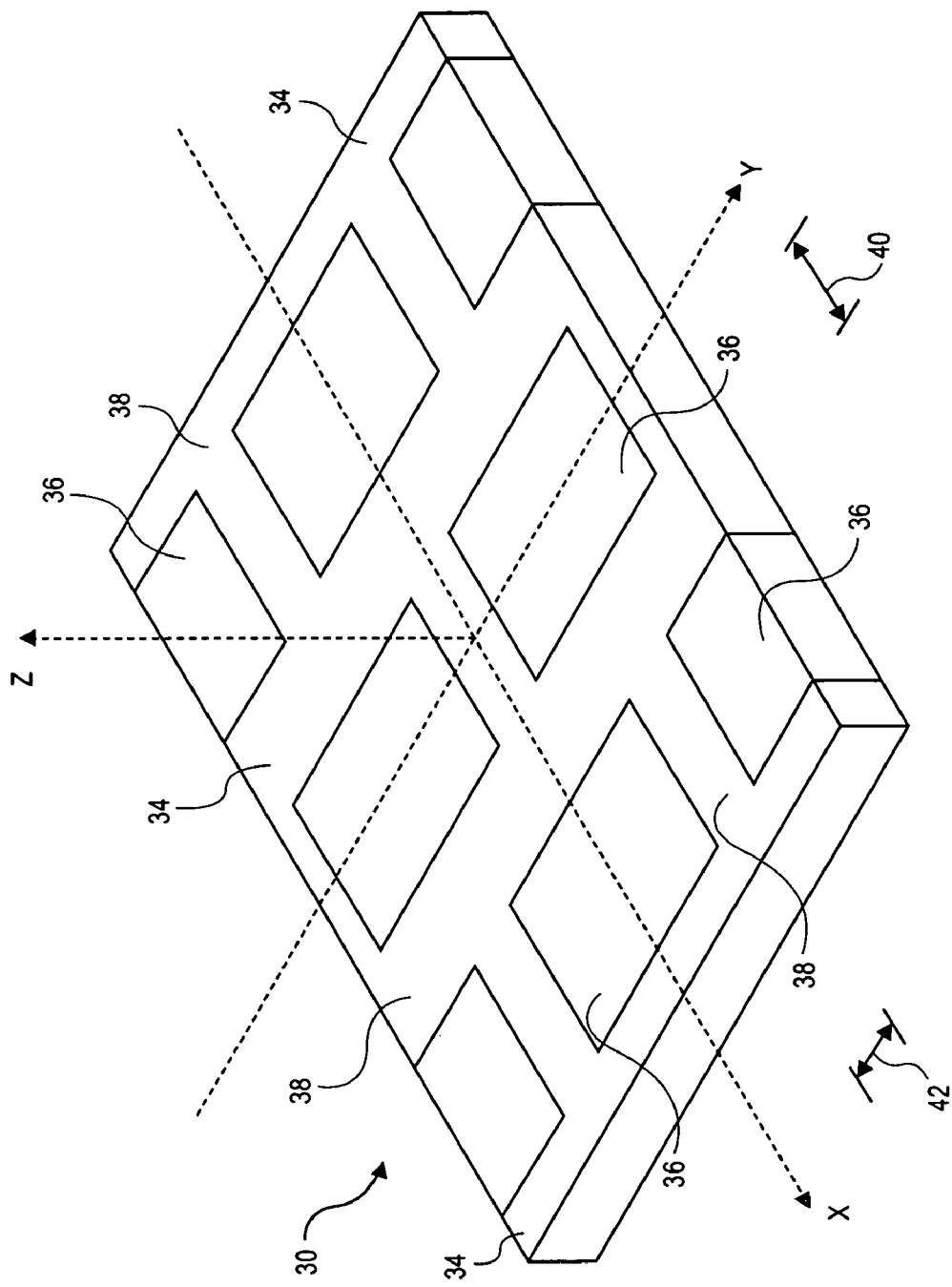
FIG. 2 is a perspective view of a portion of a mask within the stepper illustrated in FIG. 1.

FIG. 2 illustrates a portion of the reticle, or mask, 30 in greater detail. The reticle, or mask, 30 may be, for example, a 6% transmission embedded phase-shift mask (EPSM) which includes EPSM material portions 34 and glass portions 36. The combination of the sizes and shapes of the EPSM portions 34 and the glass portions 36 may create a plurality of features, or lines, 38 on the mask 30.

As illustrated, the mask 30, when compared to a Cartesian coordinate system, may be "asymmetric" in, or "oriented" towards, one of the axes such that the lines 38 have, respectively, first and second dimensions with one of the dimensions generally being greater than the other. Specifically, as illustrated in FIG. 2, the lines 38 extending in the Y-direction may have widths 40, which extend in the X-direction. The lines 38 extending in the X-direction may have widths 42, which extend in the Y-direction. In accordance with the asymmetric layout of the mask 30, an average of the widths 40 of the lines 38 extending in the Y-direction may be greater than an average of the widths 42 of the lines 38 extending in the X-direction.

The pattern of the features 38 illustrated in FIG. 2 may be referred to as a "brick-wall pattern" in which the glass portions 36 are in the shape of rectangles with the lines 38 between being made of the EPSM material portions 34.

Although only a portion of the mask 30 is illustrated, it should be understood that the mask 30 may include millions of such features of various shapes and sizes. However, the asymmetry of the mask 30 illustrated in FIG. 2 may be found across the entire mask 30. Therefore, across the entire mask 30, as with the portion illustrated in FIG. 2, an average of the widths 40 extending in the X-direction (of the lines 38 extending in the Y-direction) may be greater than an average of the widths 42 extending in the Y-direction. The widths 40 Y-direction lines 38 may be, for example, between 100 and 120 nm, and the widths 42 of the X-direction lines 38, may be, for example, between 70 and 90 nm. The lines 38 may be separated by a pitch of approximately, for example, 150 nm.

Referring again to FIG. 1 the imaging optics 32 may be positioned below the mask 30 and, although not illustrated in detail, may include a plurality of lens of varying shapes and sizes.

The computer control console may 18 be in the form of a computer having a memory for storing a set of instructions and a processor connected to the memory for executing the instructions, as is commonly understood in the art. The computer control console 18 may be electrically connected to both the substrate transport system 14 and the exposure subsystem 16, as well as all of the various components thereof, and may control and co-ordinate the various operations of the stepper 10.

In use, still referring to FIG. 1, a semiconductor substrate 44, such as a wafer having a diameter of, for example, 200 or 300 mm, may be placed on a substrate support 20 by the substrate track 22. The substrate 44 may have a plurality of partially completed integrated circuits, divided amongst multiple microelectronic dice, formed thereon and a layer of photoresist deposited on an upper surface thereof over the dice. The electromagnetic radiation source 24 may be activated to emit electromagnetic radiation, such as DUV light, through the polarization subsystem 26 and the collector 28 onto the mask 30.

Figure 3:
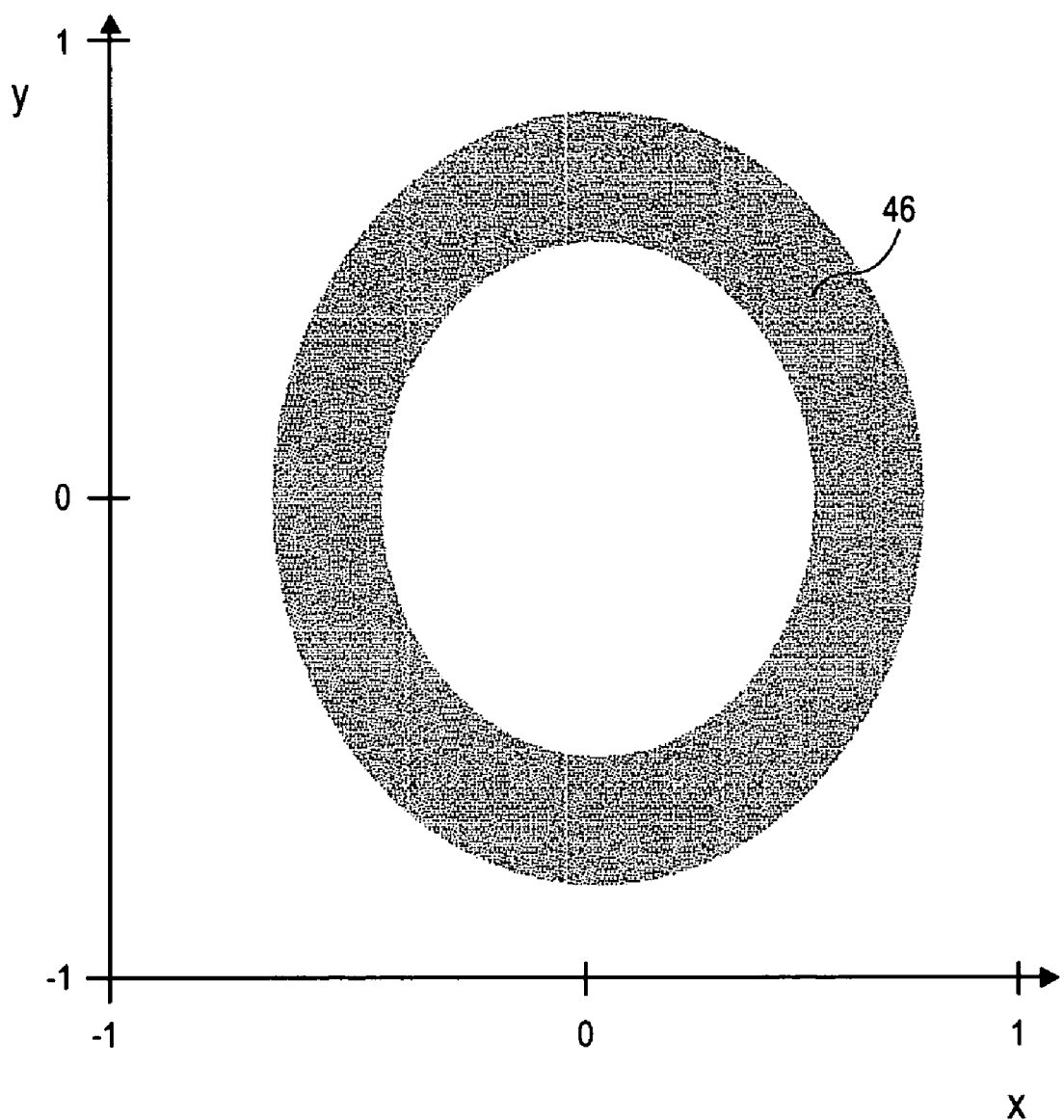
FIG. 3 is a graphical illustration of electromagnetic radiation propagating from an electromagnetic radiation source within the stepper illustrated in FIG. 1.

FIG. 3 graphically illustrates the asymmetric annular illumination of the electromagnetic radiation compared to, or viewed from, the X/Y plane of the Cartesian coordinate system, illustrated in FIG. 2, on the mask 30. Each point 46 in the graph represents a particular angle of the electromagnetic radiation as it propagates from the electromagnetic radiation source onto the mask. As illustrated, there may be no points 46 located at a central portion (0,0) of the graph. Thus, virtually no electromagnetic radiation may be propagating from the electromagnetic radiation source towards the X/Y plane with an angle of incidence of 0 degrees (i.e., normal to the X/Y plane). The points 46 may form an oval around the center of the graph that is asymmetric in a direction that is parallel to the Y-axis of the Cartesian coordinate system of the mask 30. Thus, the points 46 may be closer to the center of the graph in the X-direction than in the Y-direction. The example illustrated, as will be appreciated by one skilled in the art, may be normalized and understood to have a Y-outer sigma of 0.9, an X-outer sigma of 0.8, a Y-inner sigma of 0.585, and an X-inner sigma of 0.4.

Figure 4:
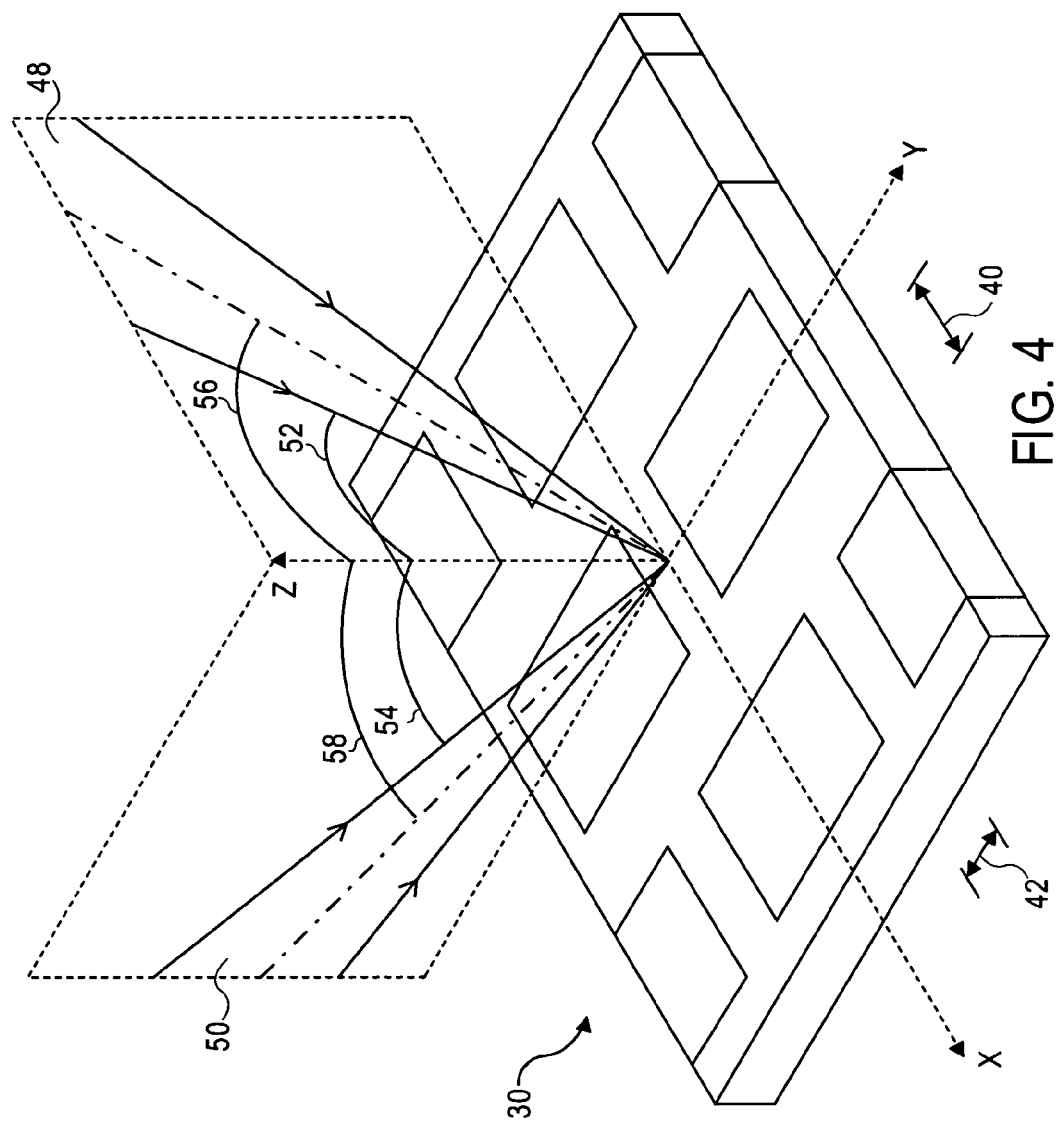
FIG. 4 is a perspective view of the portion of the mask as shown in FIG. 2 illustrating the incidence of the electromagnetic radiation thereon.

FIG. 4 illustrates the incidence of the electromagnetic radiation onto the mask 30. As illustrated, a first portion 48, or an X-beam, of the electromagnetic radiation may strike the reticle 30 in a direction that is substantially parallel to the X-axis within the X/Y plane. A second portion 50, or a Y-beam, may strike the mask 30 in a direction that is substantially parallel to the Y-axis within the X/Y plane. As one skilled in the art will appreciate, each beam 40 and 50 may comprise a plurality of rays of electromagnetic radiation each of which strikes the mask 30 at a particular angle of incidence, as measured between the particular ray and the Z-axis. Therefore, each of the rays within the X-beam 48 may strike the mask 30 at a first angle of incidence 52, and each ray within the Y-beam 50 may strike the mask 30 at a second angle of incidence 54. As illustrated, the X-beam 48, in general, may strike the mask 30 more steeply, or with a lower angle of incidence, than the Y-beam 50. In particular, an average 56 of the first angles of incidence 52 may be less than an average 58 of the second angles of incidence 54.

Thus, the electromagnetic radiation which strikes the mask 30 in a direction that is substantially parallel to the Y-axis may, and the widths 42 of the X-direction lines 38, may generally have a higher angle of incidence on the mask 30 than the electromagnetic radiation which strikes the mask 30 in a direction that is substantially parallel to the X-axis, and the widths 40 of the Y-direction lines 38. As a result, the electromagnetic radiation that is used to expose smaller, or tighter, features within the photoresist layer on the substrate 44 may strike the mask 30 with a higher angle of incidence compared to the other features within the photoresist.

Although not illustrated for clarity, it should be understood that the electromagnetic radiation shown in FIG. 4 may form an asymmetric annular ring such that the electromagnetic radiation actually strikes the mask 30 in every direction within the X/Y plane.

Referring again to FIG. 1, the electromagnetic radiation, as commonly understood in the art, may radiate through the mask 30 and into the imaging optics 32. The EPSM material on the mask may allow a partial transmission of light while changing the path-length so that it is half a wavelength out of phase with the light that passes through the glass portions 36 of the mask 30.

The imaging optics 32 may further focus the electromagnetic radiation before the electromagnetic radiation is directed onto the semiconductor substrate 44, where the electromagnetic radiation may expose the layer of photoresist. The phase difference caused by the EPSM material may cause destructive interference in some portions of the "image" on the photoresist to create darker portions within the image, which may lead to improved contrast.

The wafer support 20 may move the semiconductor substrate 44 so that individual sections of the semiconductor substrate 44, which may correspond with one or more of the dice, may be exposed one at a time. When the entire photoresist layer has been exposed, the substrate track 22 may remove the semiconductor substrate 44 from the substrate support 20, and replace it with a second semiconductor substrate to be exposed as described above.

One advantage is that the resolution of the lithographic image is improved. Therefore, smaller features may be exposed, and the pitch of the features may be reduced. Another advantage is that the contrast of the image exposed is improved.

Figure 5:
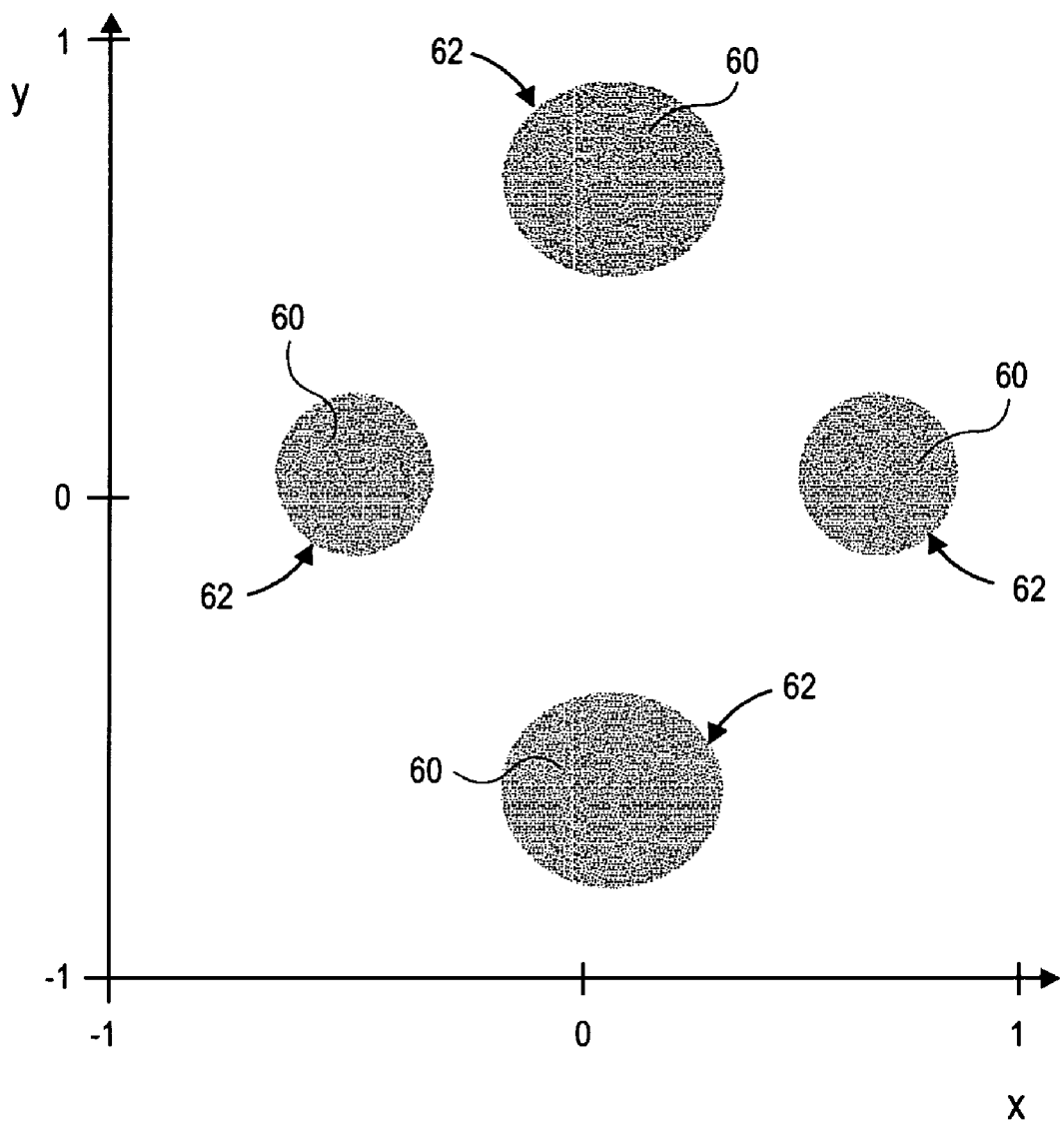
FIG. 5 is a graphical illustration of electromagnetic radiation propagating from an electromagnetic radiation source according to an alternative embodiment of the invention.

FIG. 5 graphically illustrates the illumination of an electromagnetic radiation source, according to an alternative embodiment of the present invention. The illumination illustrated may propagate from an "asymmetric quadrupole" electromagnetic radiation source. Similarly to FIG. 3, FIG. 5 shows the illumination compared to, or viewed from, the X/Y plane of the Cartesian coordinate system, illustrated in FIG. 2, on the mask 30. Each point 60 in the graph may represent a particular angle of the electromagnetic radiation as it propagates from the electromagnetic radiation source onto the mask 30. As illustrated, there may be no points 46 located at a central portion (0,0) of the graph. Thus, virtually no electromagnetic radiation may be propagating from the electromagnetic radiation source towards the X/Y plane with an angle of incidence of 0 degrees (i.e., normal to the X/Y plane).

The points 60 may form four groups, or "bundles," 62. Each bundle 62 may correspond to a group of angles that strikes the mask 30. The bundles 62 may be arranged such that two of the bundles 62 strike the mask 30 in a direction that is parallel, or substantially parallel to the Y-axis. While the other two bundles 62 may strike the mask 30 in a direction that is parallel, or substantially parallel, to the X-axis. The four bundles 62 may be asymmetric in a direction that is parallel to the Y-axis of the Cartesian coordinate system of the mask 30. Thus, the points 46 may be closer to the center of the graph in the X-direction than in the Y-direction.

In use, when the electromagnetic radiation illustrated in FIG. 5 strikes the mask 30, the portions thereof which strike the mask in the Y-direction may have, on average, a higher angle of incidence with the mask 30 than the portions which strike the mask 30 in the X-direction, similar to that illustrated in FIG. 4.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method for processing a substrate comprising:
    positioning a reticle relative to a substrate, the reticle having a plurality of features with dimensions extending in a first and a second direction and being asymmetric in the first direction; and
    directing electromagnetic radiation onto the reticle, the electromagnetic radiation having a first portion propagating onto the reticle in substantially the first direction and being incident on the reticle at a first angle and a second portion propagating onto the reticle in substantially the second direction and being incident on the reticle at a second angle, the second angle being greater than the first angle.

2. The method of claim 1, wherein the first portion of the electromagnetic radiation is incident on the reticle at a plurality of first angles and the second portion of the electromagnetic radiation is incident on the reticle at a plurality of second angles, an average of the plurality of second angles being greater than an average of the plurality of first angles.

3. The method of claim 2, wherein an average of widths of the features in the first direction is greater than an average of widths of the features in the second direction.

4. The method of claim 3, wherein the features are lines and the first and second dimensions are widths of the lines.

5. The method of claim 4, wherein the first direction is substantially perpendicular to the second direction.

6. The method of claim 5, wherein the electromagnetic radiation radiates through the reticle onto the substrate.

7. The method of claim 6, wherein the reticle is a mask within a photolithographic stepper.

8. The method of claim 7, wherein the electromagnetic radiation is light having a wavelength selected from the group consisting of 248 nm, 193 nm, and 157 nm.

9. The method of claim 8, wherein the mask is selected from the group consisting of an embedded phase shift mask, a binary mask, and a chromeless phase-shift mask.

10. The method of claim 9, wherein the substrate is a semiconductor substrate having a layer of photoresist on an upper surface of the substrate, the electromagnetic radiation radiating onto the upper surface of the substrate.

11. A method for processing a semiconductor substrate comprising:
    positioning a mask relative to an electromagnetic radiation source and a semiconductor substrate, the mask having a plurality of features thereon, the features having first dimensions extending in a first direction within a plane and second dimensions extending in a second direction within the plane, an average of the first dimensions being greater than an average of the second dimensions; and
    directing electromagnetic radiation from the electromagnetic radiation source onto the mask, the electromagnetic radiation having a first portion propagating in a third direction within the plane and being incident on the mask at a first plurality of angles and a second portion propagating in a fourth direction within the plane and being incident on the mask at a second plurality of angles, the third direction being substantially parallel to the first direction and the fourth direction being substantially parallel to the second direction, an average of the second plurality of angles being greater than an average of the first plurality of angles, at least some of the electromagnetic radiation radiating through the mask and onto the semiconductor substrate.

12. The method of claim 11, wherein the features are lines and the first and second dimensions are widths of the lines.

13. The method of claim 12, wherein the electromagnetic radiation is light having a wavelength selected from the group consisting of 248 nm, 193 nm, and 157 nm.

14. The method of claim 13, wherein the mask is selected from the group consisting of an embedded phase shift mask, a binary mask, and a chromeless phase-shift mask.

15. The method of claim 14, wherein the semiconductor substrate has a layer of photoresist on an upper surface thereof, the electromagnetic radiation radiating onto the upper surface of the substrate.

* * * * *